(12) United States Patent
Nishimura

(10) Patent No.: US 10,286,520 B2
(45) Date of Patent: May 14, 2019

(54) GRINDING APPARATUS AND GRINDING METHOD

(71) Applicant: SUMCO CORPORATION, Tokyo (JP)

(72) Inventor: Yoshinobu Nishimura, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 141 days.

(21) Appl. No.: 15/321,274

(22) PCT Filed: Feb. 26, 2015

(86) PCT No.: PCT/JP2015/055719
§ 371 (c)(1),
(2) Date: Dec. 22, 2016

(87) PCT Pub. No.: WO2015/198635
PCT Pub. Date: Dec. 30, 2015

(65) Prior Publication Data
US 2017/0157740 A1    Jun. 8, 2017

(30) Foreign Application Priority Data

Jun. 24, 2014 (JP) .................................. 2014-128975

(51) Int. Cl.
| | |
|---|---|
| *B24B 49/12* | (2006.01) |
| *B24B 49/00* | (2012.01) |
| *B24B 41/047* | (2006.01) |
| *B24B 49/02* | (2006.01) |
| *B24B 7/17* | (2006.01) |
| *G01B 21/22* | (2006.01) |
| *H01L 21/304* | (2006.01) |
| *B24B 7/22* | (2006.01) |
| *B24B 37/08* | (2012.01) |

(52) U.S. Cl.
CPC ................ *B24B 49/00* (2013.01); *B24B 7/17* (2013.01); *B24B 7/228* (2013.01); *B24B 37/08* (2013.01); *B24B 41/047* (2013.01); *B24B 49/02* (2013.01); *G01B 21/22* (2013.01); *H01L 21/304* (2013.01)

(58) Field of Classification Search
CPC ............................... B24B 49/10; B24B 49/12
USPC .......................................... 451/5, 8–10, 360
See application file for complete search history.

(56) References Cited

U.S. PATENT DOCUMENTS

2006/0009125 A1    1/2006  Okura

FOREIGN PATENT DOCUMENTS

| CN | 1631616 A | 6/2005 |
|---|---|---|
| CN | 202053116 U | 11/2011 |

(Continued)

OTHER PUBLICATIONS

Office Action issued in Chinese family member Patent Appl. No. 201580034242.5, dated Mar. 28, 2018, along with an English-language translation thereof.

(Continued)

*Primary Examiner* — Robert Rose
(74) *Attorney, Agent, or Firm* — Greenblum & Bernstein, P.L.C.

(57) ABSTRACT

A double-head grinding machine includes: a spindle driving portion configured to rotate a spindle to which a grinding wheel is attachable; a moving portion configured to move the spindle driving portions toward and away from a wafer; and an inclination measuring portion configured to measure a change in an inclination of the spindle in association with a movement of the spindle driving portions.

4 Claims, 7 Drawing Sheets

(56) References Cited

FOREIGN PATENT DOCUMENTS

| JP | 5-131349 A | 5/1993 |
|----|------------|--------|
| JP | H09-290357 A | 11/1997 |
| JP | 11-254312 A | 9/1999 |
| JP | 2000-042867 A | 2/2000 |
| JP | 2001-62718 A | 3/2001 |
| JP | 2009-95976 A | 5/2009 |
| WO | 2004/033148 A1 | 4/2004 |

OTHER PUBLICATIONS

Search Report issued in Japan Patent Application No. PCT/JP2015/055719, dated Apr. 21, 2015.
International Search Report in PCT/JP2015/055719, dated Apr. 21, 2015 with English language translation.
Taiwanese Office Action in TW Appl. No. 104108733, dated Oct. 4, 2016 with English language translation.
International Preliminary Report on Patentability in PCT/JP2015/055719, dated Dec. 27, 2016 with English language translation.
Office Action issued in Japan family member Patent Appl. No. 2014-128975, dated Jan. 30, 2018, along with an English-language translation thereof.

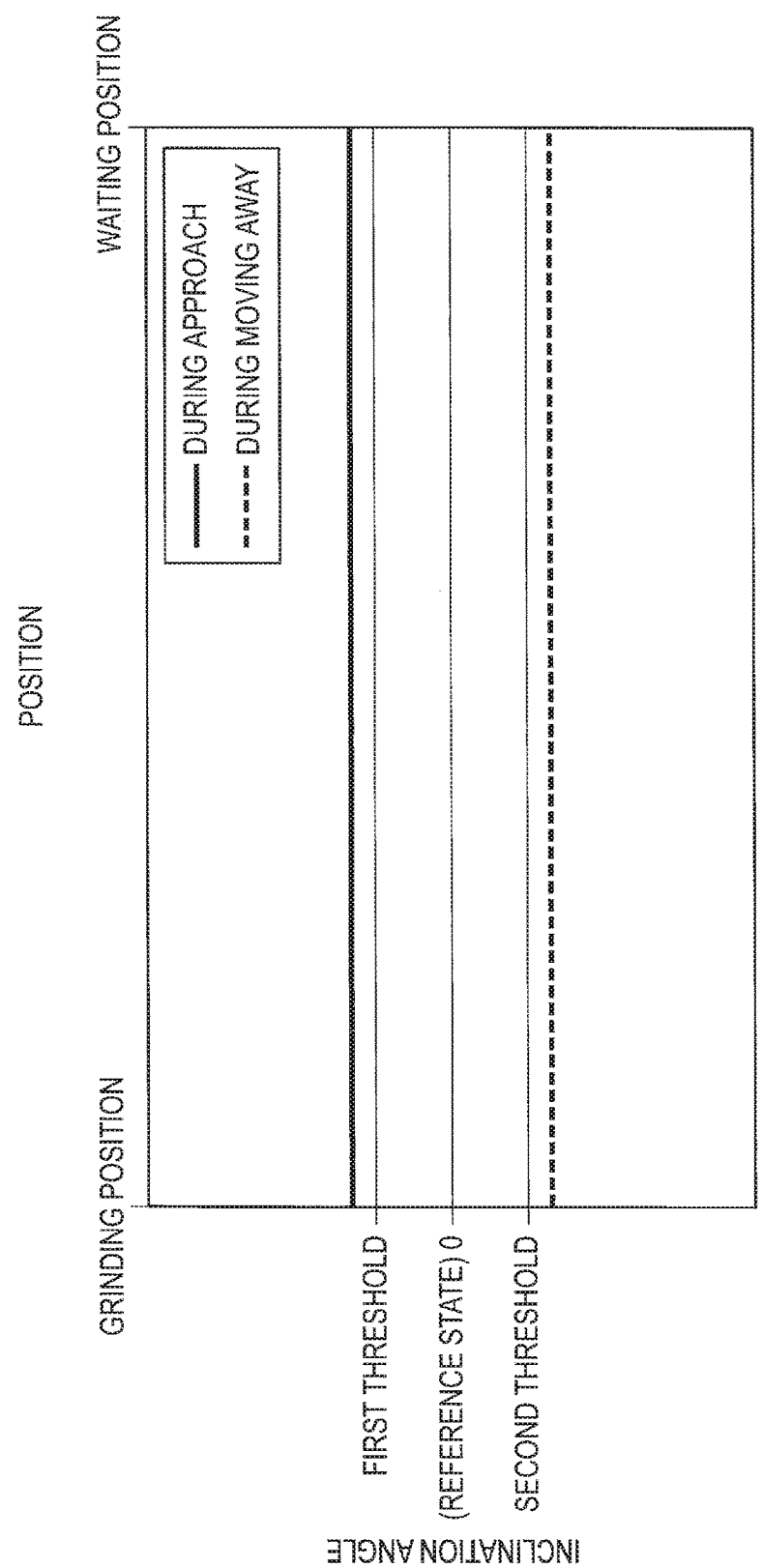

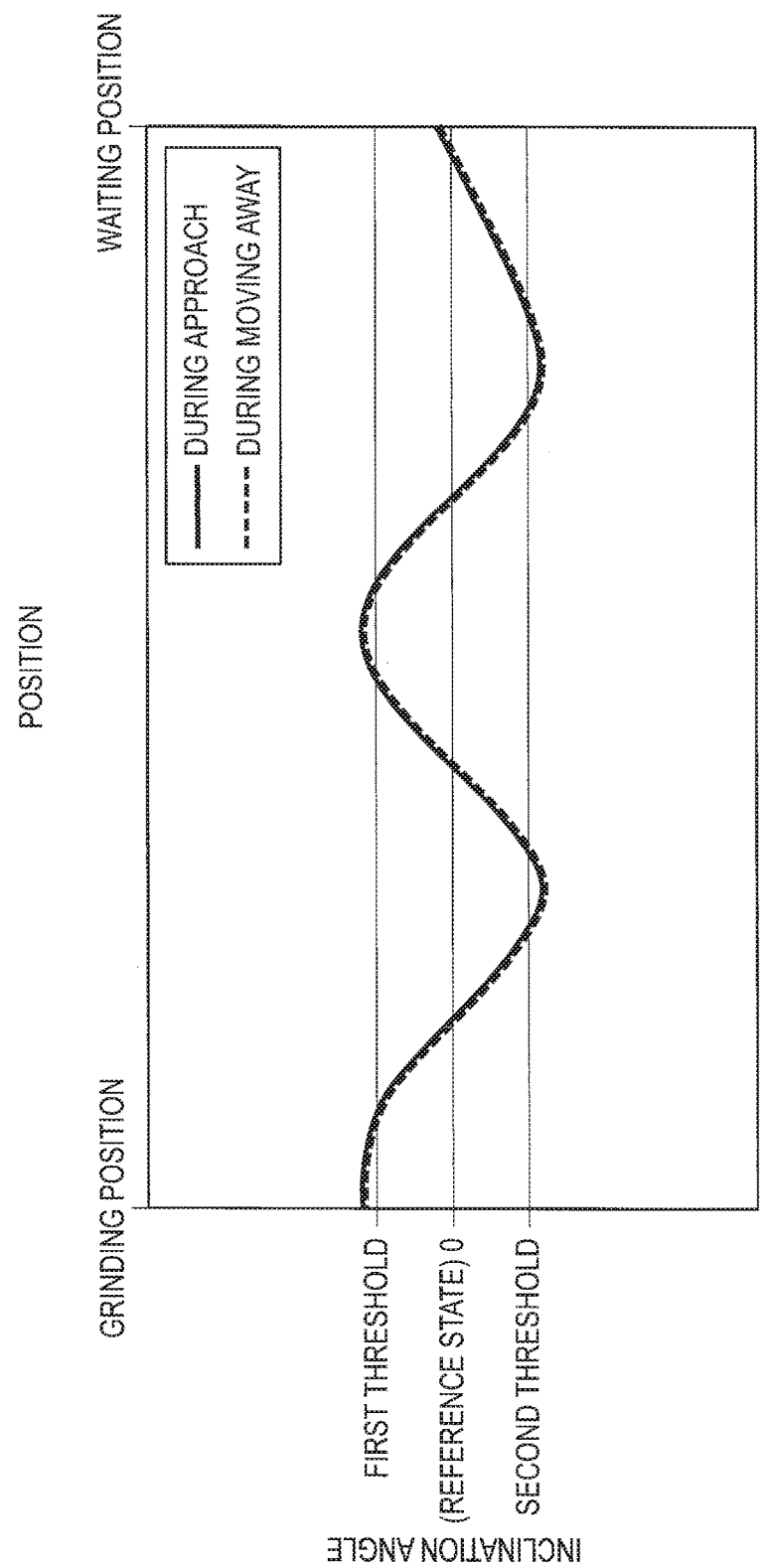

GRINDING APPARATUS AND GRINDING METHOD

TECHNICAL FIELD

The present invention relates to a grinding machine and a grinding method.

BACKGROUND ART

A technology for grinding an object to be ground has been known (see, for instance, Patent Literatures 1 and 2).

Patent Literature 1 discloses a machine for grinding (surface-processing) a semiconductor wafer (object to be ground) (hereinafter, referred to as a wafer).

This machine is configured to support at least one of rotary shafts respectively provided with ring-shaped surface plates to be pressed on both surfaces of the wafer so that the at least one of rotary shafts is tiltable, measure an inclination angle of the at least one of rotary shafts tiltably supported, estimate a shape of the wafer based on the measured inclination angle, compare the estimated result with a target shape, and tilt the at least one of rotary shafts tiltably supported according to the comparison result.

Patent Literature 2 discloses a method for simultaneously grinding both surfaces of the wafer (object to be ground).

In a machine for implementing this method, the wafer is interposed between and machined by two rotary grinding stones fixed to respective facing collinear spindles. During machining of the wafer, the wafer is guided in an axial direction in a substantially non-binding manner by two hydrostatic bearings, guided in a radial direction by a guide ring, and rotated by a driving device. During grinding of the semiconductor wafer, a distance in the radial direction between at least one of the hydrostatic bearings and the corresponding grinding stone is measured by at least two sensors, horizontal and vertical correction positions of the spindle are calculated based on the measured distance, and the positions of the spindle are corrected according to the calculation results.

CITATION LIST

Patent Literature(s)

Patent Literature 1: JP-A-11-254312
Patent Literature 2: JP-A-2009-95976

SUMMARY OF THE INVENTION

Problem(s) to be Solved by the Invention

In general, the structures as disclosed in Patent Literatures 1 and 2 include a moving portion configured to move a movable ring-shaped surface plate and a movable grinding disc (hereinafter, the movable ring-shaped surface plate and grinding disc are sometimes collectively referred to as a grinding wheel) toward and away from the wafer. For instance, when the moving portion includes: a guide rail integrated with a driving portion configured to rotate the grinding wheel; and a sliding holder holding the guide rail so that the guide rail is silidable, a phenomenon described below may occur.

When the movement of the driving portion toward and away from the wafer is repeated, for instance, the sliding holder may be worn to cause an end of the guide rail to be brought into a partial contact with the sliding holder. When the movement of the grinding wheel toward and away from the wafer is repeated in the partial contact between the guide rail and the sliding holder, the sliding holder may be further worn to cause a large rattling motion of the guide rail.

Moreover, due to the large rattling motion of the guide rail, at the moment when the grinding wheel is moved away from the wafer after grinding the wafer, inclination of the grinding wheel may be largely changed, so that the grinding wheel may collide with the wafer.

For this reason, it is preferable to replace the sliding holder depending on a wear condition thereof to minimize the rattling motion of the guide rail.

However, in the structure as disclosed in Patent Literature 1, an inclination angle of the grinding wheel on grinding the wafer is only measured. Moreover, in the structure as disclosed in Patent Literature 2, the horizontal and vertical correction positions of the spindle are only determined. Accordingly, in the structures as disclosed in Patent Literatures 1 and 2, a wear condition of the sliding holder, in other words, an abnormal condition of the moving portion cannot be recognized.

Moreover, when detecting abnormality in the structures as disclosed in Patent Literatures 1 and 2, it is assumed to remove the driving portion from the moving portion and check the wear condition of the sliding holder by visual check and measurement. During the removal of the driving portion and the examination by visual check and measurement, grinding processing cannot be conducted, so that a production efficiency declines. In this regard, in order to avoid the decline of the production efficiency, it is also conceivable to estimate the abnormal condition based on a quality of the ground water. However, since the abnormal condition cannot be recognized without checking a wafer poor in quality, a non-defective rate declines.

An object of the invention is to provide a grinding machine and a grinding method capable of recognizing the abnormal condition of the moving portion without deteriorating the production efficiency and the non-defective rate.

Means for Solving the Problem(s)

According to an aspect of the invention, a grinding machine includes: a grinding wheel configured to grind an object; a spindle driving portion configured to rotate a spindle to which the grinding wheel is attachable; a moving portion configured to move the spindle driving portion toward and away from the object; and an inclination measuring portion configured to measure a change in an inclination of the spindle in association with a movement of the spindle driving portion.

According to another aspect of the invention, a grinding method of grinding an object with a grinding wheel includes: moving toward the object a spindle driving portion configured to rotate a spindle to which the grinding wheel is attachable; rotating the spindle by the spindle driving portion to grind the object with the grinding wheel; moving the spindle driving portion away from the object; and measuring a change in an inclination of the spindle in association with a movement of the spindle driving portion.

According to the above aspects of the invention, since the change in the inclination of the spindle in association with the movement of the spindle driving portion is measured, based on the measurement result, an operator can recognize an abnormal condition of the moving portion configured to move the spindle driving portion. Moreover, when measuring the change in the inclination of the spindle, it is not necessary to stop the grinding operation or check the wafer poor in quality. Accordingly, the grinding machine and the grinding method capable of recognizing the abnormal condition of the moving portion can be provided without deteriorating the production efficiency and the non-defective rate.

It should be noted that the inclination of the spindle may be defined as an inclination with respect to a reference state where an axis of the spindle is vertical to a to-be-ground surface of a to-be-ground object or a reference state where the axis of the spindle is inclined to the to-be-ground surface of the to-be-ground object.

With the above arrangement, it is preferable that the spindle driving portion is attached with a measurement member having a flat to-be-measured surface, and the inclination measuring portion is configured to measure a change in an inclination of the to-be-measured surface as the change in the inclination of the spindle.

In the above arrangement, with a simple structure in which the measurement member is only attached to a typically used grinding machine, the change in the inclination of the spindle can be suitably measured.

The grinding machine in the above arrangement preferably further includes: a condition judging portion configured to judge whether or not the moving portion is in an abnormal condition based on a measurement result of the inclination measuring portion; and a notifier configured to notify an operator of a judgment result of the condition judging portion.

In the above arrangement, the operator can easily recognize the abnormal condition of the moving portion by the notification by the notifier.

BRIEF DESCRIPTION OF DRAWING(S)

FIG. 6 is a graph showing a change in the inclination angle of the spindle driving portion (spindle) in association with a movement of the spindle driving portion during occurrence of the rattling motion of the guide rail.

FIG. 7 is a graph showing a change in the inclination angle of the spindle driving portion (spindle) in association with a movement of the spindle driving portion when a screw shaft is curved.

DESCRIPTION OF EMBODIMENT(S)

An exemplary embodiment of the invention will be described below with reference to the attached drawings.

It should be noted that terms about directions are sometimes explained with reference to XYZ axes shown in each of figures.

Structure of Double-head Grinding Machine

Figure 1:
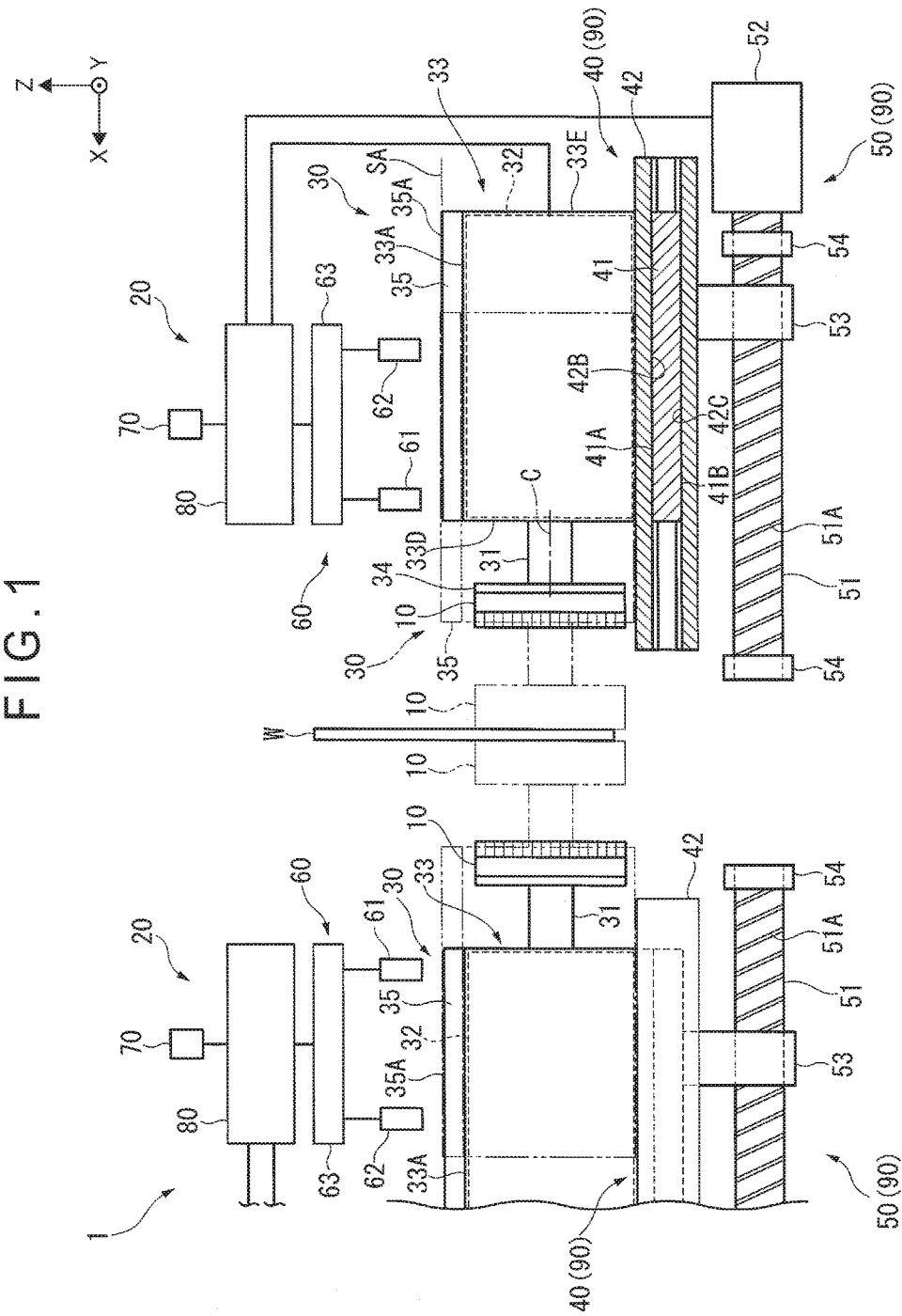
FIG. 1 is a schematic view showing an arrangement of a double-head grinding machine according to an exemplary embodiment of the invention, a part of which is a cross-sectional view taken along a I-I line of FIG. 2.

As shown in FIG. 1, a double-head grinding machine 1 (a grinding machine) grinds a wafer W (an object to be ground) using a grinding wheel 10. The double-head grinding machine 1 includes: a carrier ring (not shown) holding the wafer W therein; a pair of grinding portions 20 disposed on both sides of the wafer W held by the carrier ring; and a grinding liquid supplier (not shown) configured to supply a grinding liquid into the grinding wheel 10.

Each of the grinding portions 20 includes: a spindle driving portion 30; a support 40; an advancement and retraction driver 50; an inclination measuring portion 60; a notifier 70; and a controller 80 as a condition judging portion. The support 40 and the advancement and retraction driver 50 serve as a moving portion 90.

The spindle driving portion 30 is configured to rotate the spindle 31. The spindle driving portion 30 includes: a rotary motor 32 having the spindle 31; and a casing 33 receiving the rotary motor 32 therein.

A wheel attachment portion 34, to which the grinding wheel 10 is detachably attachable, is provided to a leading end of the spindle 31.

The rotary motor 32 is electrically connected to the controller 80.

Figure 2:
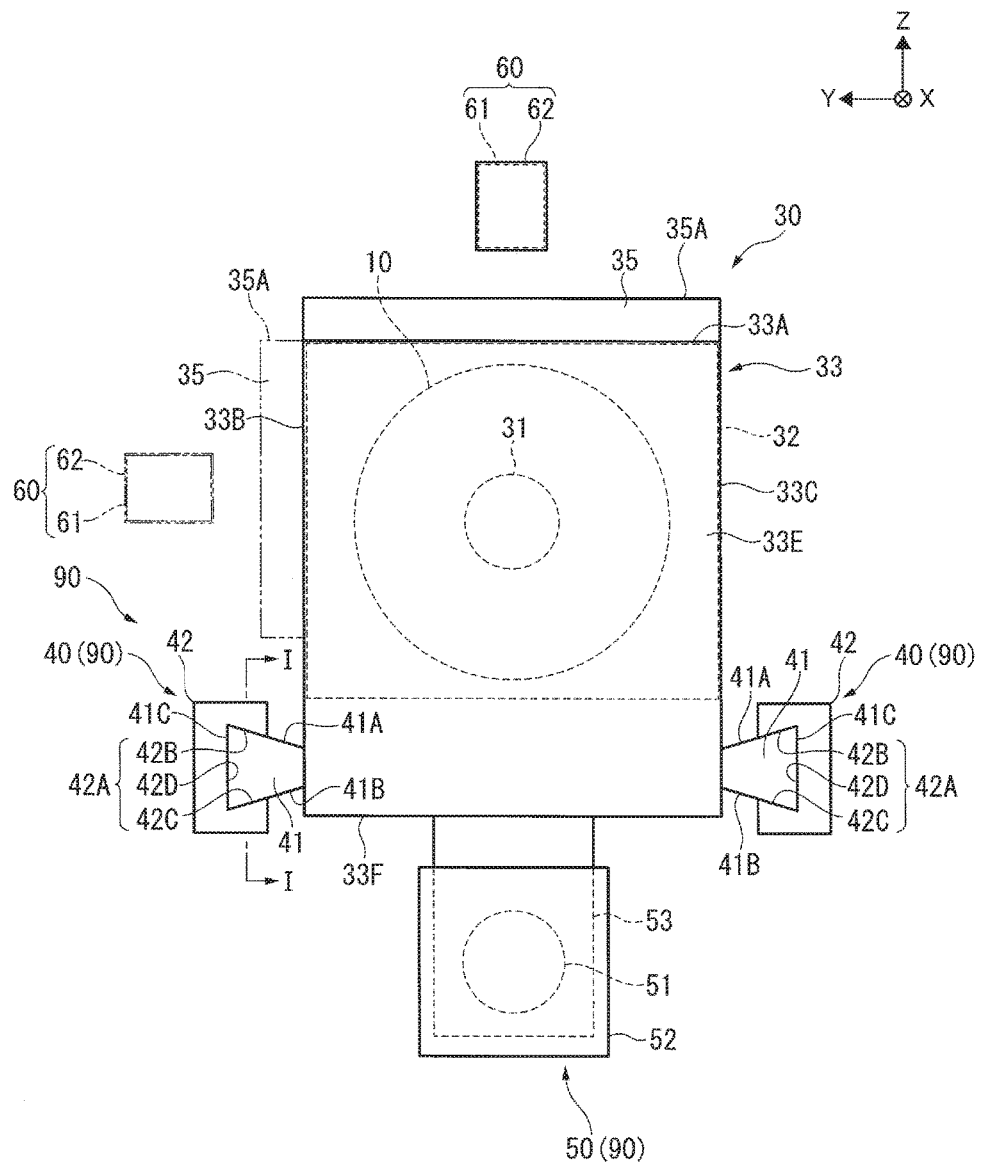
FIG. 2 is a schematic view showing the double-head grinding machine seen in a X direction.

The casing 33 is in a shape of a rectangular box as shown in FIG. 2. A measurement plate 35 (measurement member) is attached on an upper surface (±Z directional surface) 33A of the casing 33. The measurement plate 35 is attached on the upper surface 33A so that a flat to-be-measured surface 35A faces upward (in a +Z direction) and is substantially in parallel to a center axis C of the spindle 31.

The support 40 supports the spindle driving portion 30 so that the spindle driving portion 30 is movable in a direction (in an X-axis direction) to move toward and away from the wafer W. The support 40 includes: a pair of guide rails 41; and a pair of sliding holders 42

The respective guide rails 41 are integrated with a lower part of a first side surface 33B of the casing 33 in a +Y direction and a lower part of a second side surface 33C in a −Y direction. Each of the guide rails 41 extends in the X-axis direction with a first end near the front surface 33D facing the wafer W and a second end near the rear surface 33E opposite from the front surface 33D.

Each of the guide rails 41 is in a shape of a trapezoid as seen from the rear surface 33E. Each of the guide rails 41 includes a first slide surface 41A, a second slide surface 41B, and a third slide surface 41C. The first slide surface 41A and the second slide surface 41B are respectively defined on oblique sides of the trapezoid. The third slide surface 41C is defined on a long one of a pair of parallel sides of the trapezoid.

Each of the sliding holders 42 is fixed to a frame (not shown). Each of the sliding holders 42 includes a concave portion 42A holding each of the guide rails 41 so that each of the guide rails 41 is slidable. The concave portion 42A is in a shape corresponding to a contour of each of the guide rails 41. The concave portion 42A includes a first contact surface 42B in contact with the first slide surface 41A, a second contact surface 42C in contact with the second slide surface 41B, and a third contact surface 42D in contact with the third slide surface 41C.

The sliding holders 42, in a state of not being worn, is configured to hold the guide rails 41 so that the guide rails 41 are slidable, by bringing the first, second and third contact surfaces 42B, 42C and 42D into a surface contact with the respective first, second and third slide surfaces 41A, 41B and 41C.

The advancement and retraction driver 50 includes: a moving motor 52 configured to rotate a screw shaft 51 extending in the X-axis direction; a nut 53 having, on an inner circumferential surface, a screw groove (not shown) facing a screw groove 51A of the screw shaft 51; a plurality of balls (not shown) provided rollably in a spiral ball-rolling space defined between the screw groove 51A of the screw shaft 51 and the screw groove of the nut 53; and a pair of bearings 54 respectively supporting both ends of the screw shaft 51.

The moving motor 52 is electrically connected to the controller 80. The nut 53 is provided near a rear edge (a remote edge from the wafer W) of a lower surface (a −Z directional surface) 33F of the casing 33.

The advancement and retraction driver 50 moves the spindle driving portion 30 supported by the support 40 in the +X direction and the −X direction when the controller 80 controls the moving motor 52 and the screw shaft 51 to rotate.

The inclination measuring portion 60 is fixed to the frame (not shown). The inclination measuring portion 60 includes a first sensor 61, a second sensor 62, and an inclination calculator 63.

The first and second sensors 61, 62 are non-contact sensors. The first and second sensors 61, 62 are electrically connected to the inclination calculator 63. The first and second sensors 61 and 62 are provided in alignment with the X-axis direction at an upper side of a movement path of the spindle driving portion 30. The first sensor 61 is provided closer to the wafer W than the second sensor 62. The first and second sensors 61 and 62 are disposed so that the to-be-measured surface 35A is positioned under the first and second sensors 61 and 62 when the spindle driving portion 30 is located at a waiting position shown in a solid line in FIG. 1 and when the spindle driving portion 30 is located at a grinding position shown in a chain double-dashed line. Each of the first and second sensors 61 and 62 detects a Z-axis directional distance to the to-be-measured surface 35A and outputs the detection result to the inclination calculator 63.

Figure 3:
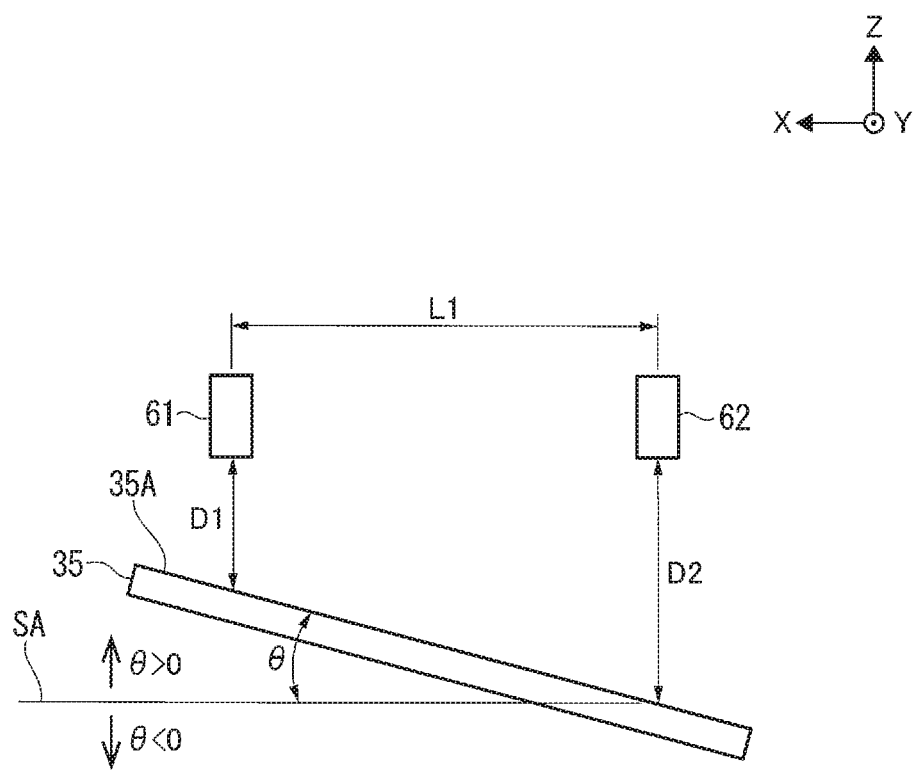
FIG. 3 is an illustration for explaining a calculation method of an inclination angle of a spindle driving portion.

The inclination calculator 63 is electrically connected to the controller 80. The inclination calculator 63 calculates a change in inclination of the to-be-measured surface 35A based on the detection results from the first and second sensors 61 and 62. For instance, as shown in FIG. 3, given that the shortest distance from the first sensor 61 to the second sensor 62 is denoted by L1, the Z-axis directional distance from the first sensor 61 to the to-be-measured surface 35A is denoted by D1, the Z-axis directional distance from second sensor 62 to the to-be-measured surface 35A is denoted by D2, and an inclination angle of the to-be-measured surface 35A with reference to an XY plane SA (reference plane) is denoted by θ, the inclination calculator 63 calculates the inclination angle θ according to a formula (1) below.

$$\theta = \text{Tan}^{-1}((D2-D1)/L1) \quad (1)$$

The inclination calculator 63 outputs the calculation result of the inclination angle θ to the controller 80.

As described above, the to-be-measured surface 35A is provided so as to be substantially in parallel to the center axis C of the spindle 31. For this reason, the inclination angle θ calculated by the inclination calculator 63 is approximately equal to an inclination angle of the spindle 31 with reference to the XY plane SA, in other words, an inclination angle of the spindle 31 with reference to a state where the spindle 31 is perpendicular to the wafer W.

It should be noted that at least one of the first sensor 61 and the second sensor 62 may be a contact sensor.

The notifier 70 is electrically connected to the controller 80. The notifier 70 notifies an operator of various information in accordance with the control of the controller 80. For instance, the notifier 70 notifies the operator of information based on the change in the inclination angle of the spindle 31 measured by the inclination measuring portion 60. A configuration of the notifier 70 for notifying the operator of various information can be exemplified by means such as sounds, letters, symbols and colors recognizable by the operator.

The controller 80 performs various control by CPU (Central Processing Unit) configured to process a program and data stored in a storage (not shown).

A tilt mechanism for freely adjusting the inclination of the spindle 31 may be provided to the grinding portions 20.

Grinding Method

Next, a grinding method using the double-head grinding machine 1 will be described.

The grinding method will be exemplarily described in an instance where the inclination angle θ of the spindle 31 is zero when the to-be-measured surface 35A is in parallel to the XY plane SA, in other words, when the spindle 31 is perpendicular to the wafer W.

First, the operator instructs a carrier ring (not shown) hold the wafer W. Next, the controller 80 controls the moving motor 52 to move a pair of spindle driving portions 30 attached with the respective grinding wheels 10 toward the wafer W. The controller 80 also controls the rotary motor 32 to rotate the spindle 31 while controlling the grinding liquid supplier (not shown) to supply a grinding liquid into each of the grinding wheels 10. Further, the controller 80 drives the carrier ring to rotate the wafer W while pressing the pair of grinding wheels 10 moved to the grinding position onto both surfaces of the wafer W, thereby grinding the wafer W.

After finishing grinding the wafer W, the controller 80 moves the pair of spindle driving portions 30 away from the wafer W. When the spindle driving portion 30 moves to the respective waiting positions, the ground wafer W is replaced with a new wafer W by the operator, a robot or the like, and a next grinding starts.

During the movement of the spindle driving portions 30, the controller 80 controls the inclination calculator 63 to acquire, at every predetermined time or at every predetermined position, the calculation result of the inclination angle θ of the spindle 31 in conjunction with the movement of the spindle driving portions 30 based on the detection results of the first sensor 61 and the second sensor 62. For instance, the controller 80 acquires the inclination angle θ while each of the spindle driving portions 30 is in a reciprocating motion in a space defined between the waiting position and the grinding position.

During the grinding of the wafer W, the controller 80 does not need to acquire the calculation result of the inclination angle θ. Alternatively, the controller 80 may acquire the inclination angle θ only while each of the spindle driving portions 30 is moving through a part of the space defined between the waiting position and the grinding position.

The controller 80 judges whether or not the moving portion 90 is in an abnormal condition based on the change in the inclination angle θ. When the controller 80 determines that the moving portion 90 is in the abnormal condition, the controller 80 controls the notifier 70 to notify the operator of the abnormal condition as information based on the change in the inclination angle θ.

When a reciprocating movement of the spindle driving portions 30 with respect to the wafer W is repeated, at least one of the first and second slide surfaces 41A, 41B of the guide rail 41 and the first and second contact surfaces 42B, 42C of the sliding holder 42 becomes worn. For instance, when the first and second contact surfaces 42B, 42C of the sliding holder 42 are worn as shown in FIG. 4, a rattling motion of the guide rail 41 occurs in conjunction with this wear condition.

Figure 4:
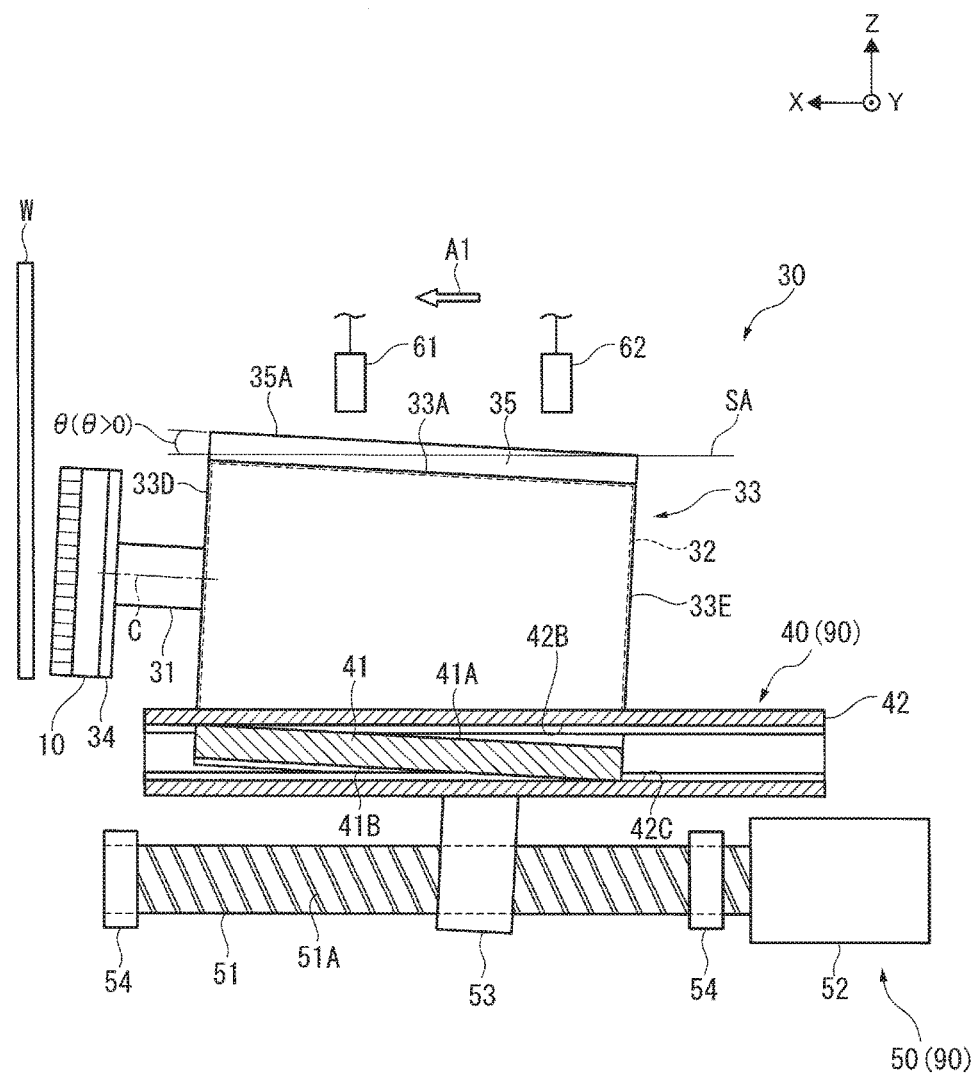
FIG. 4 is a schematic view showing a state where the spindle driving portion approaches a wafer during occurrence of a rattling motion of a guide rail.

When one of the spindle driving portions 30 is moved toward the wafer W as shown by the arrow A1 in FIG. 4 while the rattling motion of the guide rail 41 occurs, the spindle driving portion 30 is moved with a front end in the moving direction being at a higher position than a rear end, in other words, in an inclined state so that the inclination angle θ between the spindle driving portion 30 and the spindle 31 is larger than zero. When one of the spindle driving portions 30 is moved away from the wafer W as shown by the arrow A2 in FIG. 5, the spindle driving portion 30 is moved in an inclined condition so that the inclination angle θ is smaller than zero.

When the spindle driving portion 30 is thus moved, a front end in the above moving direction of the guide rail 41 near the first slide surface 41A and a rear end in the moving direction of the guide rail 41 near the second slide surface 41B are respectively brought into a partial contact with the first contact surface 42B and the second contact surface 42C of the sliding holder 42. Accordingly, the first and second contact surfaces 42B and 42C are further worn, thereby further increasing the rattling motion of the guide rail 41.

Figure 5:
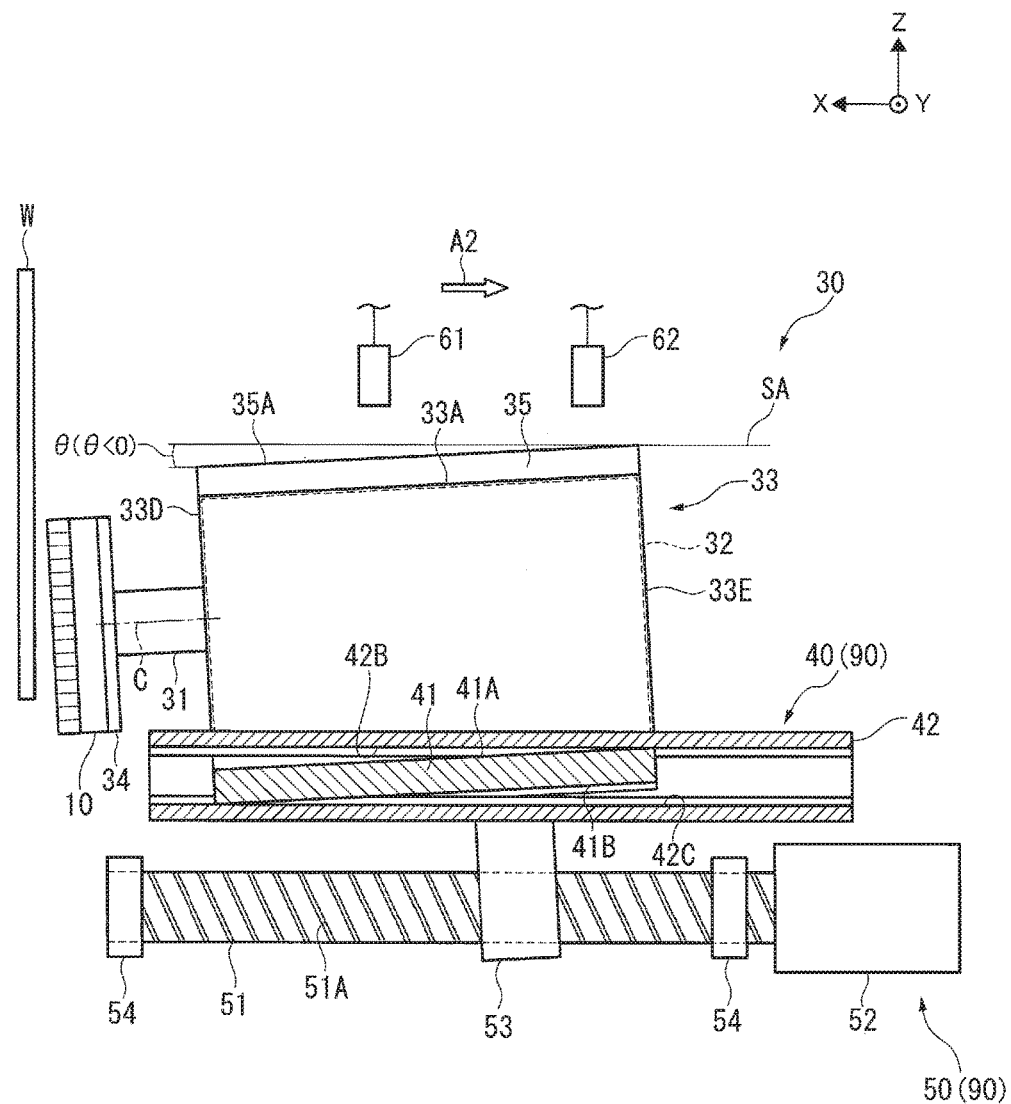
FIG. 5 is a schematic view showing a state where the spindle driving portion moves away from the wafer during occurrence of the rattling motion of the guide rail.

Moreover, when the spindle driving portion 30 is moved as shown in FIGS. 4 and 5, since an inclination of the grinding wheel 10 is significantly changed at the time of switching the moving direction of the spindle driving portion 30, an upper side of the grinding wheel 10 may collide with the wafer W to damage or break the wafer W.

As shown in FIG. 6, when the inclination angle θ of the spindle 31 exceeds a first threshold larger than zero while the spindle driving portion 30 is being moved toward the wafer W and the inclination angle θ is smaller than a second threshold smaller than zero while the spindle driving portion 30 is being moved toward the wafer W, the controller 80 determines that the support 40 of the moving portion 90 is in an abnormal condition since the rattling motion of the guide rail 41 occurs. The controller 80 notifies via the notifier 70 the operator that the moving portion 90 is in an abnormal condition.

On the other hand, when the inclination angle θ is equal to and smaller than the first threshold and is equal to and larger than the second threshold while the spindle driving portions 30 is moved toward and away from the wafer W, the controller 80 determines that the support 40 is not in an abnormal condition. It is not a requisite that the controller 80 notifies the operator that the support 40 is not in an abnormal condition via the notifier 70 when determining that the support 40 is not in an abnormal condition When the screw shaft 51 is curved, the inclination angle θ is changed in a manner to vibrate in a constant cycle as shown in FIG. 7. In this arrangement, the front end in the moving direction of the guide rail 41 near the first slide surface 41A and the rear end in the moving direction of the guide rail 41 near the second slide surface 41B are respectively brought into strong contact with the first contact surface 42B and the second contact surface 42C of the sliding holder 42. As a result, the first and second contact surfaces 42B and 42C are further worn, whereby the rattling motion of the guide rail 41 occurs.

As shown in FIG. 7, the controller 80 determines that the advancement and retraction driver 50 of the moving portion 90 is in an abnormal condition when the maximum value of the inclination angle θ larger than the first threshold and the minimum value of the inclination angle 0 is smaller than the second threshold, and the controller 80 determines that the advancement and retraction driver 50 is not in an abnormal condition when the maximum value is equal to or smaller than the first threshold and the minimum value is equal to or larger than the second threshold. The controller 80 notifies via the notifier 70 the operator of the judgment result about the advancement and retraction driver 50. The controller 80 may notify the operator of the judgment result on the support 40 and the judgment result on the advancement and retraction driver 50 in the same manner or different manners.

When the operator recognizes that the support 40 is in the abnormal condition, the operator replaces at least one of the guide rail 41 and the sliding holder 42 for maintenance, When the operator recognizes that the advancement and retraction driver 50 is in the abnormal condition, the operator replaces at least one of the screw shaft 51, nut 53, ball, and bearings 54 for maintenance.

Advantage(s) of Embodiment(s)

The above exemplary embodiment provides the following advantages.

(1) The controller 80 of the double-head grinding machine 1 measures the change in the inclination angle of the spindle 31 in association with the movement of the spindle driving portions 30. Accordingly, the operator can recognize that the support 40 or advancement and retraction driver 50 of the moving portion 90 is in the abnormal condition based on the measurement result by the controller 80. Moreover, it is not necessary to stop the grinding operation or check the wafer W poor in quality when measuring the change in the inclination angle of the spindle 31. Accordingly, the double-head grinding machine 1 capable of recognizing the abnormal condition of the moving portion 90 can be provided without deteriorating a production efficiency and a non-defective rate.

(2) The measurement plate 35 having the to-be-measured surface 35A is attached to the casing 33 of the spindle driving portions 30. The inclination measuring portion 60 measures the change in the inclination angle θ of the to-be-measured surface 35A as the change in the inclination angle θ of the spindle 31.

Accordingly, with a simple structure in which the measurement plate 35 is only attached to the typically used double-head grinding machine 1, the change in the inclination angle of the spindle 31 can be suitably measured.

(3) Since the controller 80 of the double-head grinding machine 1 notifies the operator of the condition of the moving portion 90 via the notifier 70, the operator can easily recognize that the moving portion 90 is in the abnormal condition.

Other Embodiment(s)

It should be noted that the invention is not limited to the above exemplary embodiment, but may include a variety of improvements or design changes compatible with the invention.

For instance, without attaching the measurement plate 35 to the spindle driving portions 30, the inclination measuring portion 60 may measure the change in the inclination angle of the upper surface 33A of the casing 33 as the change in the inclination angle of the spindle 31. Moreover, as shown by the chain double-dashed line in FIG. 2, the measurement plate 35 may be provided to the first side surface 33B of the casing 33 and the first and second sensors 61 and 62 may be provided at positions facing the measurement plate 35. With this arrangement, the inclination angle θ of the spindle 31 with respect to the XZ plane can be measured.

Although two sensors (the first sensor 61 and the second sensor 62) are juxtaposed to the inclination measuring portion 60 in the X-axis direction, three or more sensors may be juxtaposed in the X-axis direction. Alternatively, only one sensor capable of measuring the inclination angle of the to-be-measured surface 35A may be provided at the upper side of the movement path of the spindle driving portion 30.

Instead of judging whether or not the moving portion 90 is in the abnormal condition, the controller 80 may control the notifier 70 to display the change in the inclination angle of the spindle 31 and the operator may recognize the abnormal condition of the moving portion 90 based on this display.

The support 40 may include balls and rollers disposed on the first, second and third contact surfaces 42B, 42C and 42D of the sliding holders 42. The spindle driving portions 30 may be moved by rotating the balls and rollers.

The controller 80 may drive the tilt mechanism according to the inclination angle of the spindle 31 to adjust the inclination of the spindle 31.

Although the double head grinding processing of simultaneously grinding both surfaces of the wafer W is described as the example of use of the grinding machine of the invention, the grinding machine of the invention may be used for a grinding processing for only one surface of the wafer W. Examples of the object to be ground may be ones other than the wafer W such as ceramics and stones.

The invention claimed is:

1. A grinding machine comprising:
    a grinding wheel configured to grind an object;
    a spindle driving portion configured to rotate a spindle to which the grinding wheel is attachable;
    a moving portion configured to move the spindle driving portion toward and away from the object; and
    an inclination measuring portion configured to measure a change in an inclination of the spindle in association with a movement of the spindle driving portion, wherein
    the moving portion comprises: a support supporting the spindle driving portion so that the spindle driving portion is movable; and an advancement and retraction driver configured to move the spindle driving portion supported by the support, and
    the support comprises: a guide rail provided to the spindle driving portion; and a sliding holder holding the guide rail so that the guide rail is slidable.

2. The grinding machine according to claim 1, wherein
    the spindle driving portion is attached with a measurement member having a flat to-be-measured surface, and
    the inclination measuring portion is configured to measure a change in an inclination of the to-be-measured surface as the change in the inclination of the spindle.

3. The grinding machine according to claim 1, further comprising:
    a condition judging portion configured to judge whether or not the moving portion is in an abnormal condition based on a measurement result of the inclination measuring portion; and
    a notifier configured to notify an operator of a judgment result of the condition judging portion.

4. A grinding method of grinding an object with a grinding wheel, the grinding method comprising:
    moving toward the object a spindle driving portion configured to rotate a spindle to which the grinding wheel is attachable by sliding a guide rail provided to the spindle driving portion along a sliding holder holding the guide rail;
    rotating the spindle by the spindle driving portion to grind the object with the grinding wheel;
    moving the spindle driving portion away from the object by sliding the guide rail along the sliding holder; and
    measuring a change in an inclination of the spindle in association with a movement of the spindle driving portion.

* * * * *